United States Patent
Kashyap et al.

(10) Patent No.: US 9,947,647 B2
(45) Date of Patent: Apr. 17, 2018

(54) METHOD AND SYSTEM FOR OVER-VOLTAGE PROTECTION USING TRANSIENT VOLTAGE SUPPRESSION DEVICES

(71) Applicant: General Electric Company, Schenedtady, NY (US)

(72) Inventors: Avinash Srikrishnan Kashyap, Niskayuna, NY (US); Peter Micah Sandvik, Niskayuna, NY (US); Mark Gerard Roberto, New Richmond, OH (US); David Mulford Shaddock, Troy, NY (US); Joe Walter Kirstein, Orland Park, IL (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 943 days.

(21) Appl. No.: 14/102,632

(22) Filed: Dec. 11, 2013

(65) Prior Publication Data

US 2015/0162743 A1 Jun. 11, 2015

(51) Int. Cl.
*H02H 9/04* (2006.01)
*H01L 27/02* (2006.01)

(52) U.S. Cl.
CPC ......... *H01L 27/0248* (2013.01); *H02H 9/041* (2013.01); *Y10T 29/49117* (2015.01)

(58) Field of Classification Search
CPC ...... H02H 9/04; H02H 9/041; H01L 27/0248; Y10T 29/49117
See application file for complete search history.

(56) References Cited

U.S. PATENT DOCUMENTS

| | | | | |
|---|---|---|---|---|
| 4,893,158 A | * | 1/1990 | Mihara | H01L 27/0251 257/341 |
| 5,045,820 A | * | 9/1991 | Leicht | H01P 5/107 333/238 |
| 5,703,520 A | * | 12/1997 | Dikeman | H03K 17/0814 327/327 |
| 5,793,586 A | * | 8/1998 | Rockot | H01H 33/596 361/8 |
| 6,195,245 B1 | * | 2/2001 | Kobsa | H04M 3/18 361/119 |
| 6,496,060 B2 | | 12/2002 | Takita | |
| 6,680,839 B2 | | 1/2004 | Napiorkowski | |
| 7,104,462 B2 | | 9/2006 | Shearer | |
| 8,541,787 B2 | * | 9/2013 | Zhang | H01L 29/1095 257/133 |
| 2004/0188706 A1 | * | 9/2004 | Chang | H01L 25/072 257/177 |
| 2008/0218922 A1 | * | 9/2008 | Mallikararjunaswamy | H01L 27/0262 361/91.6 |
| 2009/0055793 A1 | * | 2/2009 | Melzner | G06F 17/5077 716/130 |
| 2012/0176718 A1 | * | 7/2012 | Jorgensen | H02H 9/046 361/111 |
| 2012/0262832 A1 | * | 10/2012 | Adomaitis | H04Q 1/116 361/119 |

(Continued)

*Primary Examiner* — Zeev V Kitov
(74) *Attorney, Agent, or Firm* — John P. Darling

(57) ABSTRACT

A method of fabricating an overvoltage protection device and an over-voltage circuit protection device are provided. The over-voltage circuit protection device includes a plurality of transient voltage suppression (TVS) devices coupled in electrical parallel.

20 Claims, 9 Drawing Sheets

(56) References Cited

U.S. PATENT DOCUMENTS

2013/0181525 A1     7/2013   de Jesus et al.
2013/0301320 A1*   11/2013   Mariadassou ........... H02M 7/08
                                                                      363/70

* cited by examiner

METHOD AND SYSTEM FOR OVER-VOLTAGE PROTECTION USING TRANSIENT VOLTAGE SUPPRESSION DEVICES

BACKGROUND

This description relates to semiconductor electronic devices, and, more particularly, to a method and system for providing over-voltage protection using semiconductor devices.

Metal Oxide Varistors (MOV) are passive over-voltage protection devices that are used widely in electronic circuits. MOVs have a high energy absorption capability and can therefore withstand currents of, for example, several kilo Amperes (kA). However, MOVs also have several disadvantages such as, but, not limited to: (a) a relatively high resistance due to relatively low alpha (α) values; (b) a high voltage drop, which exposes any sensitive electronic circuits being protected, to voltages that can be detrimental for the circuit health; (c) a limited life, because at a peak rated current of the MOV, the MOV is rated for a limited number of over-voltage events at the rated breakdown voltage as the dielectric material of which the MOV is made degrades substantially each time high currents flow through it; (d) a relatively large active area requirement due to a low current density of the MOV material to enable them to carry a relatively high current; (e) a relatively high capacitance; and (f) a potential flammability/explosivity hazard at certain fault conditions because of potting materials that MOVs contain.

Although silicon devices have been used for preventing sensitive electronics coupled in parallel to transient voltage suppressor (TVS) devices from being subjected to voltage spikes caused by, for example, lightning strikes and being damaged, they are not suitable for high temperature operation. Silicon devices tend to leak higher current as temperature increases, with the current reaching unacceptably high values in ambient temperatures greater than approximately 150° C., which makes them unsuitable to be used in ambient temperatures of 225° C. or more needed for aviation applications requiring core engine-mounted electronics such as distributed engine control or for large current carrying applications where $I^2R$ losses can account for the high temperature in the device. Moreover, known TVS devices typically are packaged using epoxy encapsulation. Epoxy packaging tends to induce large thermal strains within the TVS device structure above approximately 185° C. and to begin to decompose.

BRIEF DESCRIPTION

In one embodiment, an over-voltage circuit protection device includes a plurality of transient voltage suppression (TVS) devices coupled in electrical parallel.

In another embodiment, a method of fabricating an over-voltage protection device includes selecting a first plurality of transient voltage suppression (TVS) devices and coupling the first plurality of TVS devices in electrical parallel such that during an over-voltage event, the first plurality of TVS devices each carry an approximately equal current.

In yet another embodiment, a wide-bandgap semiconductor over-voltage protection device includes a substrate formed of wide-bandgap semiconductor material and a plurality of wide-bandgap semiconductor transient voltage suppression (TVS) devices at least one of coupled to the substrate and formed on the substrate, the TVS devices electrically coupled together in parallel, a conduction area and a number of TVS devices selected based on a current carrying rating of the over-voltage protection device. The over-voltage protection device also includes a plurality of electrical leads configured to electrically connect the over-voltage protection device to a circuit, and an electronics package surrounding the substrate, the plurality of TVS devices, and a portion of the leads.

DRAWINGS

These and other features, aspects, and advantages of the present disclosure will become better understood when the following detailed description is read with reference to the accompanying drawings in which like characters represent like parts throughout the drawings, wherein.

Figure 1:
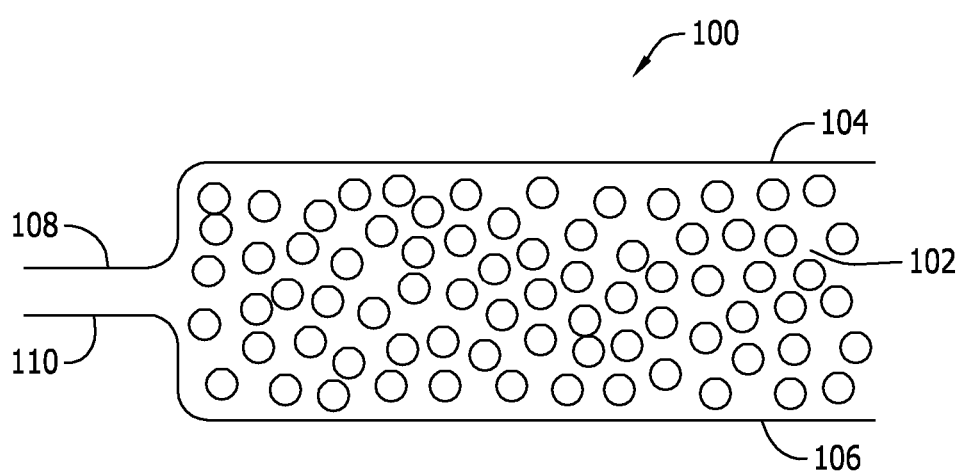
FIG. 1 is a schematic view of a metal-oxide varistor (MOV).

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

The following detailed description illustrates embodiments of the disclosure by way of example and not by way of limitation. It is contemplated that embodiments of the disclosure have general application to semiconductor fabrication for industrial, commercial, and residential applications.

Embodiments of the present disclosure describe a semi-conductor MOV replacement device that uses solid-state wide-bandgap transient voltage suppression (TVS) devices connected in parallel to replicate the action of the MOV without the disadvantages of MOVs described herein. By connecting smaller area TVS devices in parallel, the current is shared approximately equally amongst the parallel TVS devices, if they are well-matched, thereby providing a means to conduct high currents (several kAs).

There are several configurations for paralleling devices, which involve putting two or more TVS chips in an array. In various embodiments, the devices are well matched to have similar turn-on or trigger voltages, as well as series resistance values so the devices share current evenly. In some embodiments, the device selection is done in advance of the packaging in which the devices are binned into groups for voltage and resistance properties after parametric testing on-wafer. Devices are spaced apart to suppress arcing or localized hot spots in the package. In various embodiments, devices are placed in a linear, rectangular or square array to minimize area without semiconductor chips and thereby minimize overall package area. In various embodiments a series resistor, having a relatively small value of resistance, is added to each TVS device, to help promote equal current sharing among TVS devices. The resistors, if used, are precision resistors, with values larger than the series resistance of the TVS devices, but also chosen so as to not provide a major increase in the series resistance of the TVS-resistor combination.

In other embodiments, resistors having a resistance value that increases with increasing temperature may also promote current sharing across the array, by redirecting current away from the hottest devices in transients.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The following description refers to the accompanying drawings, in which, in the absence of a contrary representation, the same numbers in different drawings represent similar elements.

FIG. 1 is a schematic view of a metal-oxide varistor 100 (MOV). MOV 100 includes a ceramic mass of zinc oxide grains, in a matrix 102 of other metal oxides, such as, but, not limited to bismuth, cobalt, and/or manganese sandwiched between two metal plates 104, 106 that serve as electrodes. A respective lead 108, 110 extends from plates 104 and 106 to permit electrically coupling plates 104 and 106 to circuitry external to MOV 100. A boundary between each grain and an adjacent grain forms a diode junction, which allows current to flow in only one direction. The mass of randomly oriented grains is electrically equivalent to a network of back-to-back diode pairs, each pair in parallel with many other pairs. When a small or moderate voltage is applied across the electrodes, only a relatively small current flows, caused by reverse leakage through the diode junctions. When a large voltage is applied, the diode junction breaks down due to a combination of thermionic emission and electron tunneling, and a large current flows. The result of this behavior is a nonlinear current-voltage characteristic, in which the MOV has a high resistance at low voltages and a low resistance at high voltages.

Figure 2:
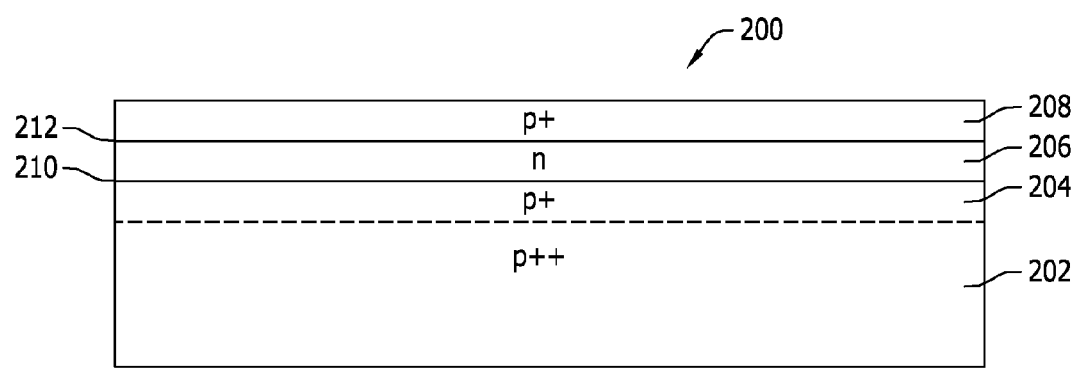
FIG. 2 is a cross-sectional schematic view of a punch-through bi-directional transient-voltage suppressor (TVS) device.

FIG. 2 is a cross-sectional schematic view of a punch-through bi-directional transient-voltage suppressor (TVS) device 200. In the example embodiment, TVS 200 is formed on a p++ semiconductor substrate 202. A first epitaxial p+ region 204 is initially formed on an upper surface of substrate 202. An epitaxial n region 206 is then formed on the upper surface of first epitaxial p+ region 204, and a second epitaxial p+ region 208 is formed on the upper surface of epitaxial n region 206. TVS 200 includes two junctions, a junction 210 formed at an interface of epitaxially grown p+ region 204 and epitaxially grown n region 206, and a junction 212 formed at an interface of epitaxially grown n region 206 and epitaxially grown p+ region 208. Although shown in FIG. 2 as a triple-epitaxial TVS device, in other embodiments, TVS 200 is formed of five layers and not all layers are formed by epitaxy, but rather some layers are formed by ion implantation, diffusion, or other method. In various embodiments, TVS device 200 utilizes avalanche technology or punch-through technology to operate as described herein.

Figure 3:
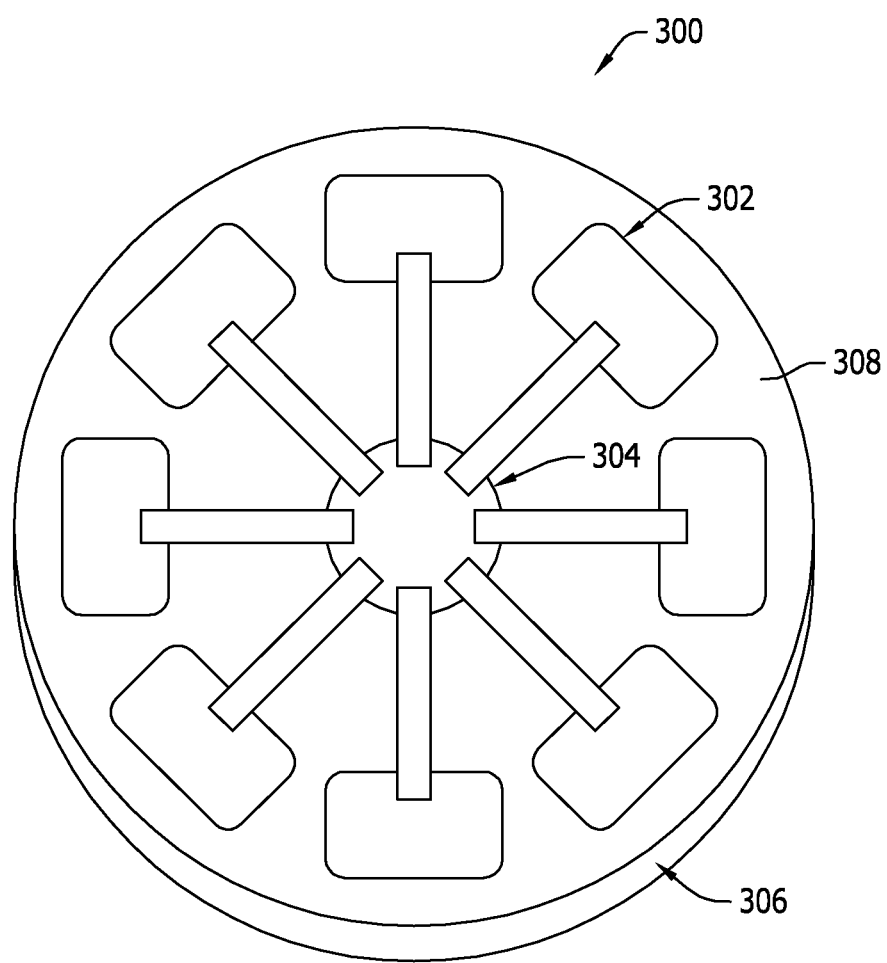
FIG. 3 is a plan view of an MOV replacement device formed of a plurality of semi-conductor transient voltage suppression (TVS) devices electrically coupled in parallel in accordance with an example embodiment of the present disclosure.

FIG. 3 is a plan view of an MOV replacement device 300 formed of a plurality of semi-conductor transient voltage suppression (TVS) devices 302 electrically coupled in parallel. In the example embodiment, eight TVS devices 302 are coupled electrically in parallel between two electrodes 304 and 306. The TVS devices 302 are mounted to a substrate 308, which is non-conductive. To improve the electrical performance of MOV replacement device 300, TVS devices 302 are selected based on the electrical characteristics of each TVS device 200. For example, during a manufacturing process of TVS devices 302, each TVS device or a plurality of TVS devices 302 in lots are tested for their electrical characteristics. Based on the tests, TVS devices 302 are binned with other TVS devices 302 of like characteristics. When MOV replacement device 300 is assembled, TVS devices 302 of like characteristics are easily selected for inclusion in an assembly of MOV replacement device 300. Selecting TVS devices 302 of like characteristics facilitates an equal sharing of current flow through MOV replacement device 300 amongst all TVS devices 302.

Figure 4:
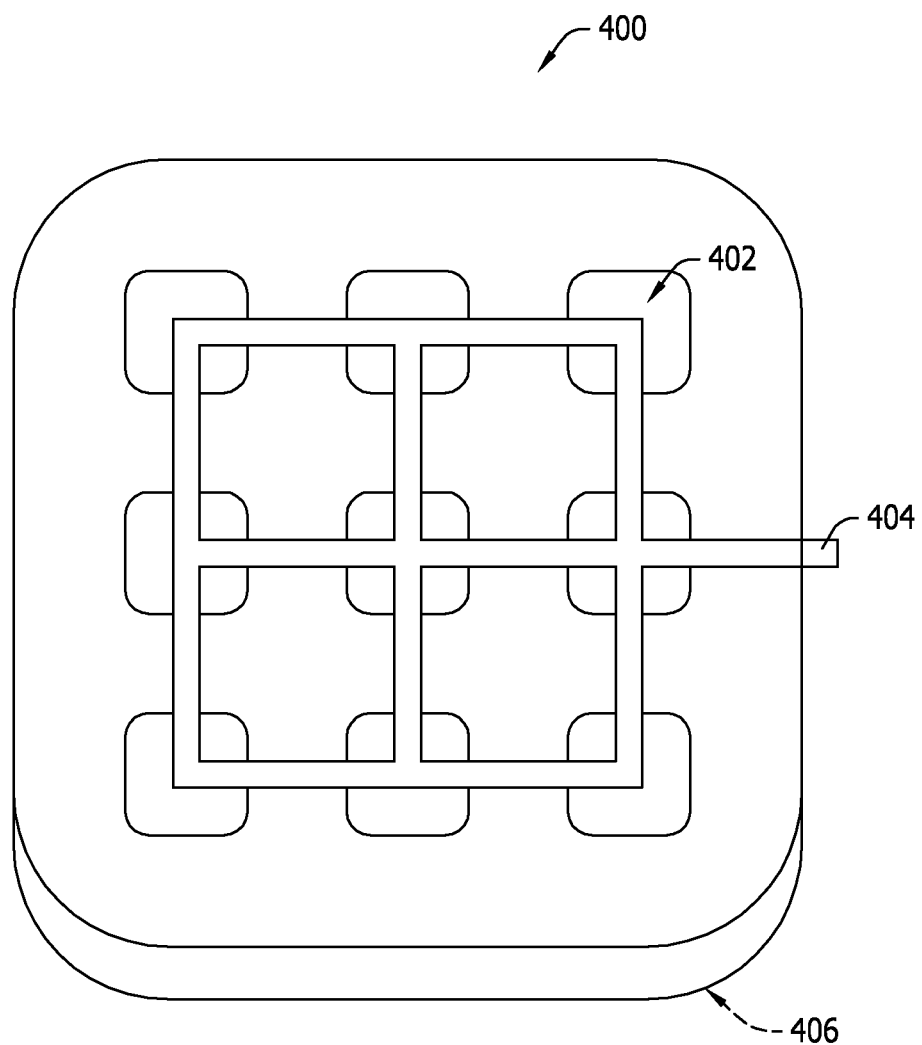
FIG. 4 is a plan view of another embodiment of an MOV replacement device formed of a plurality of semi-conductor TVS devices electrically coupled in parallel.

FIG. 4 is a plan view of another embodiment of an MOV replacement device 400 formed of a plurality of semi-conductor TVS devices 402 electrically coupled in parallel. In the example embodiment, nine TVS devices 402 are coupled electrically in parallel between two electrodes 404 and 406. One or both of electrodes 404 and 406 are formed of a conductive grid as shown in FIG. 4.

Figure 5:
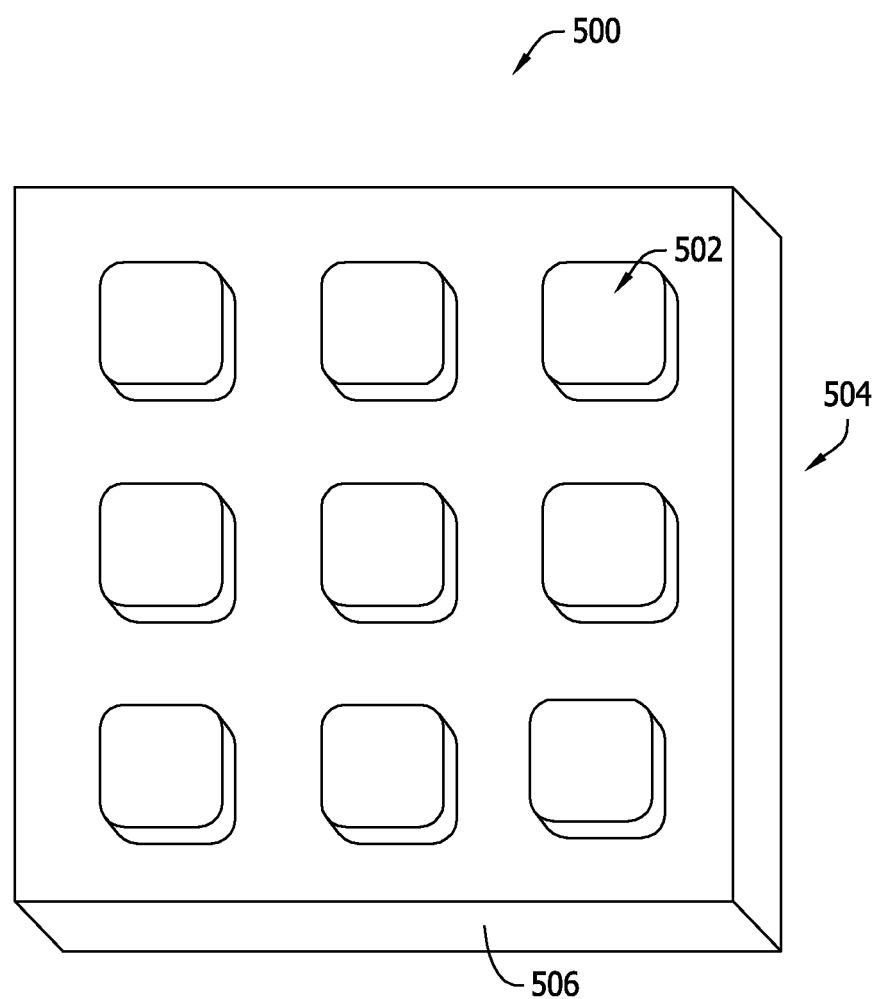
FIG. 5 is a plan view of another embodiment of an MOV replacement device formed of a plurality of semi-conductor TVS devices.

FIG. 5 is a plan view of another embodiment of an MOV replacement device 500 formed of a plurality of semi-conductor TVS devices 502. In the example embodiment, TVS devices 502 are formed of a single die 504 of TVS substrate material with individual TVS devices 502 formed therein. Portions of die 504 are cut down to a level of a substrate 506. A conductor (not shown) is then attached to the back of substrate 506 and a connection made to each of TVS devices 502. On the front side (the visible side in FIG. 5), a grid conductor is used as shown in FIG. 4.

Figure 6:
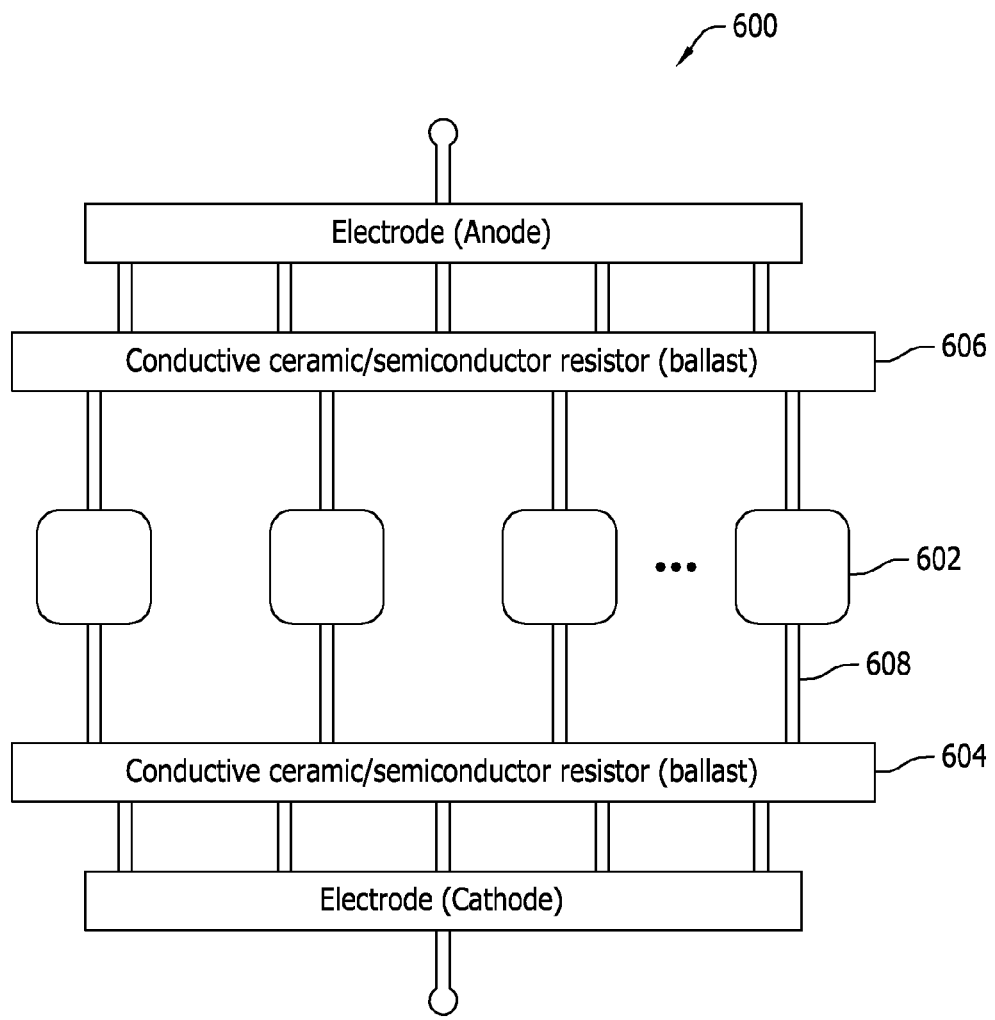
FIG. 6 is a schematic view of another embodiment of an MOV replacement device.

FIG. 6 is a schematic view of another embodiment of an MOV replacement device 600. In the example embodiment, MOV replacement device 600 includes a plurality of parallelly connected semiconductor TVS devices 602 that are each connected in series with one or more resistors, 604 and/or 606, having a resistance that is relatively larger than a resistance of TVS devices 602 in a turned on state. TVS devices 602 are coupled to resistors 604 and/or 606 using respective wirebonds 608 and solder. The resistance of resistors 604 and/or 606 is selected to be about one or more orders of magnitude greater than the resistance of TVS devices 602 in a turned on state. Resistors 604 and/or 606 serve to even a current flow through TVS devices 602 so that the current flow through each of the devices when tuned-on is approximately equal. An even current flow through all TVS devices 602 reduces performance issues due to hotspots where a greater current flow in one TVS device 602 yields greater $I^2R$ losses associated with each TVS device 602 having a relatively lower resistance than the other TVS devices 602.

Figure 7:
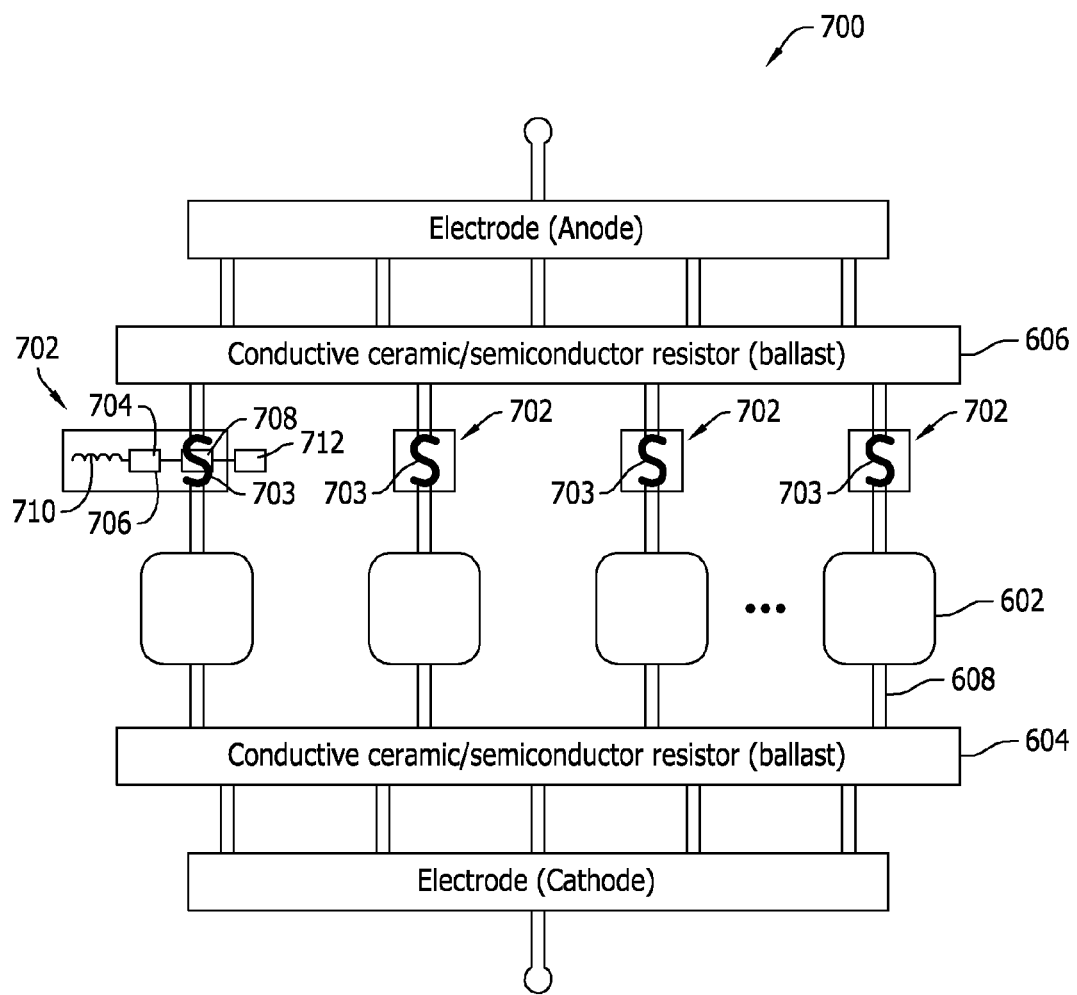
FIG. 7 is a schematic view of another embodiment of an MOV replacement device.

FIG. 7 is a schematic view of another embodiment of an MOV replacement device 700. In the example embodiment, MOV replacement device 700 includes components similar to MOV replacement device 600 and further includes a fuse device 702 electrically coupled in series with at least some of TVS devices 602. In one embodiment, fuse device 702 is a resettable overcurrent device. In other embodiments, fuse device 702 includes a fuse element 703 and an arc shield 704, which, upon activation of fuse element 703 is displaced from a first inactive position 706 to a second active position 708. Active position 708 tends to facilitate extinguishing a power-flow-through arc that may be formed as fuse element 703 melts or is displaced during an over-current condition. Arc shield 704 is displaced under the force of, for example, a bias member 710, such as but not limited to, a spring. In various embodiments, a position indicator, such as, a microswitch 712 is positioned to detect a position of arc shield 704. A position indication signal is transmitted to a display system (not shown) for indicating that fuse device 702 has actuated. Benefits of using arc shield 704 on MOV replacement device 700 are related to system reliability and include an ability to sense a status of MOV replacement device 700. Knowing when MOV replacement device 700 is no longer protecting a load is extremely important. Moreover, arc shield 704 reduces catastrophic failure of MOV replacement device 700 by interrupting the excessive current that is flowing through MOV replacement device 700 after it enters the failure mode. Knowing when MOV replacement device 700 is failed and that when it fails that it will not fail to a complete short increases system reliability.

Figure 8:
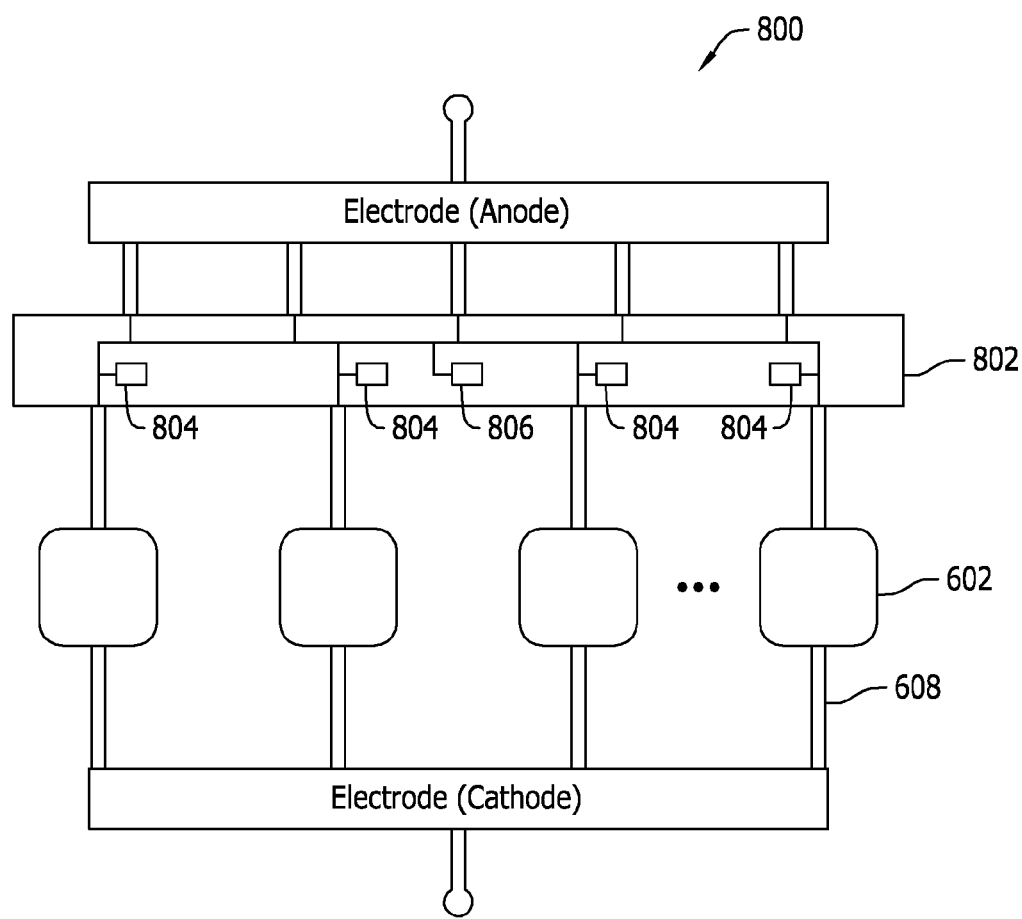
FIG. 8 is a schematic view of another embodiment of an MOV replacement device.

FIG. 8 is a schematic view of another embodiment of an MOV replacement device 800. In the example embodiment, MOV replacement device 800 includes components similar to MOV replacement device 600 and further includes an active electronics 802 with feedback for current sharing management.

Active electronics 802 include current sensors 804 and a feedback loop 806 to control a flow of current in each of TVS devices 602. If one of a plurality of parallel TVS devices 602 is carrying more current than TVS devices 602 in the remainder of the plurality of TVS devices 602, then, through feedback loop 806, the current that flows through the one TVS device 602 is reduced such that current is redirected to the remainder of the plurality of TVS devices 602. For example, in an embodiment, active electronics 802 alters a resistance of the TVS devices 602 to change the current flow.

In one embodiment, active electronics 802 is a separate chip packaged along with TVS devices 602 in an MOV replacement package. In various embodiments, active electronics 802 and TVS devices 602 are monolithically integrated onto a common substrate.

Embodiments of over-voltage circuit protection devices, also referred to as replacement MOVs, described herein are formed of a wide-bandgap semiconductor material, such as, but not limited to silicon carbide. Wide-bandgap semiconductor material is able to withstand high temperatures without significantly degrading their performance. For example, devices formed of wide-bandgap semiconductor material operate satisfactorily at temperatures of approximately 300° Celsius or higher, whereas typically constructed MOVs can only withstand temperatures of approximately 85° Celsius. In various embodiments, the semiconductor material of the TVS devices, which are used to form the MOV replacement devices have a bandgap is greater than 2.2 eV. In an embodiment, the total peak current capability of the over-voltage circuit protection device exceeds 10 kA. In another embodiment total peak current capability of the over-voltage circuit protection device exceeds 5 kA. In a further embodiment, the total peak current capability of the over-voltage circuit protection device exceeds 5 kA. Additionally, a leakage current through the over-voltage circuit protection device is configured to be less than 10 µA at approximately 125 degrees Celsius, the leakage current being the current through the over-voltage circuit protection device at approximately 50% of the turn-on voltage of the over-voltage circuit protection device.

Figure 9:
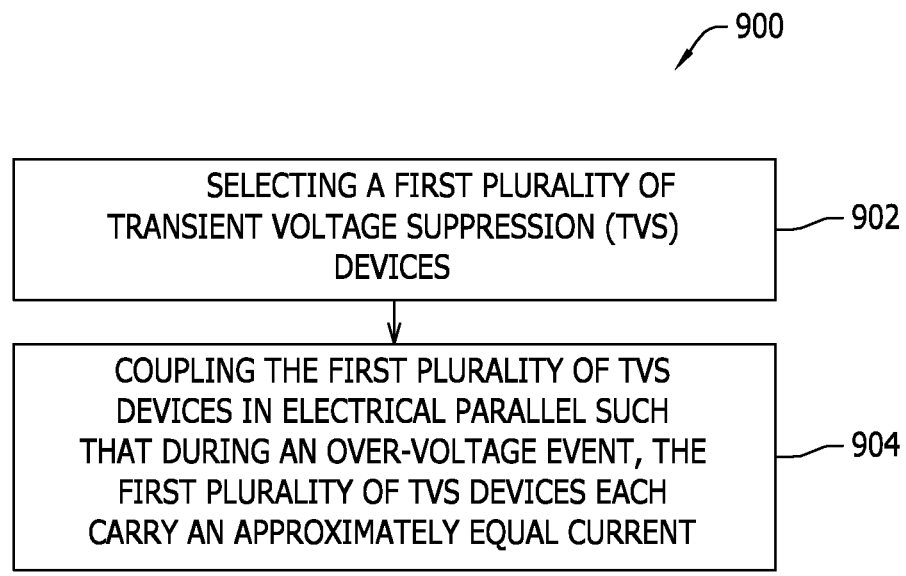
FIG. 9 is a flowchart of an example method of fabricating an overvoltage protection device.

FIG. 9 is a flowchart of an example method 900 of fabricating an overvoltage protection device. In the example embodiment, method 900 includes selecting 902 a first plurality of transient voltage suppression (TVS) devices and coupling the first plurality of TVS devices in electrical parallel such that during an over-voltage event, the first plurality of TVS devices each carry an approximately equal current. In an embodiment, method 900 further includes coupling 904 a resistance device having at least one of a predetermined resistance value and a controllable resistance value in electrical series with at least some of the TVS devices. In the example embodiment, the resistance device comprises a fixed resistor having a predetermined resistance value selected to be approximately one order of magnitude greater than a resistance of the respective TVS device. In various embodiments, the resistance device comprises a semiconductor device, such as, but, not limited to a transistor.

Another way to ensure substantially equal current will pass through each TVS device during operation is to select the TVS devices that will be in the same overvoltage protection device to have approximately equal electrical characteristics. After being formed, each TVS device is generally tested for function by measuring various electrical parameters of the TVS device. Instead of just noting the electrical characteristic values, and potentially rejecting those TVS devices that do not meet predetermined criteria, in various embodiments of the present disclosure, the TVS devices are binned according to similarities in their electrical characteristics. In this way, TVS devices of similar electrical characteristics can be easily selected for use in the same overvoltage protection device. Having similar electrical characteristics as other TVS devices in the same overvoltage protection device permits each TVS device to share current approximately equally, thereby reducing a possibility of hotspots due to excessive $I^2R$ losses.

Current through the first plurality of TVS devices can also be actively controlled by an active electronics current controller positioned on-board overvoltage protection device and proximate the TVS devices. In an embodiment, respective current sensors are coupled to each TVS device and configured to generate a signal indicative of a current flowing through the TVS device, the generated signal is transmitted to an active electronics current controller that controls the current though each of the TVS devices using, for example, a feedback control loop using the generated signals such that the current flowing through each of the first plurality of TVS devices is approximately equal.

Because the overvoltage protection device is formed of wide-bandgap semiconductor material, the overvoltage protection device can operate at relatively high temperature with little degradation in performance and/or current leakage. For example, an overvoltage protection device formed of, for example, but not limited to SiC or GaAs, is capable at operating at temperatures of approximately 300° C. and higher. This temperature operating range is significantly above the operating range of present overvoltage protection devices, which are typically limited to operations below approximately 85° C.

The above-described embodiments of an overvoltage protection device and a method of fabricating an overvoltage protection device provides a cost-effective and reliable means for replacing a traditional MOV type overvoltage protection device. More specifically, the methods and systems described herein facilitate selecting a plurality of semiconductor devices and fabricating an overvoltage protection device using the plurality of semiconductor device coupled in electrical parallel with respect to each other. In addition, the above-described methods and systems facilitate forming the overvoltage protection device of wide-bandgap semiconductor material to permit operation of the overvoltage protection device at temperatures above approximately 85° C. As a result, the methods and systems described herein facilitate replacing the ceramic matrix MOV with a wide-bandgap semiconductor transient voltage suppression device in a cost-effective and reliable manner.

In addition to the above described benefits, wide-bandgap (WBG) semiconductors, including silicon carbide (SiC), offer much higher current density than their lower bandgap counterparts (e.g. silicon-based devices) given their more robust nature. This directly facilitates much higher current capability for a given TVS device volume compared to existing and Si-based devices and also offers a significant volumetric improvement over existing metal oxide varistor devices, based on dielectric materials. Further, by coupling a plurality of WBG devices in electrical parallel, even greater power density benefits can be attained while achieving total peak current ratings of up to 100,000 amps or more for devices designed for a wide range of turn-on voltages.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An over-voltage circuit protection device comprising a plurality of transient voltage suppression (TVS) devices, each formed of a wide-band-gap semiconductor material and coupled in electrical parallel with respect to each other, further comprising active electronics configured to control a flow of current in each of the TVS devices, the active electronics including:
   a current sensor associated with each of the plurality of TVS devices, each current sensor configured to generate a signal indicative of an amount of current flowing through a respective one of the plurality of TVS devices; and
   a feedback circuit configured to receive the generated current flow signals and generate control signals configured to modify a current flow through the respective TVS devices.

2. The device of claim 1, further comprising:
   a substrate formed of wide-bandgap semiconductor material;
   wherein at least one of the plurality of TVS device is coupled to the substrate and formed on the substrate, a conduction area and a number of TVS devices are selected based on a current carrying rating of the over-voltage protection device, wherein said plurality of TVS devices operate using punch-through physics, avalanche, or combinations thereof; the device further comprising
   a plurality of electrical leads configured to electrically connect the over-voltage protection device to a circuit; and
   an electronics package surrounding the substrate, the plurality of TVS devices, and a portion of the leads.

3. The system of claim 2, wherein the wide-bandgap semiconductor material comprises at least one of silicon carbide (SiC), gallium nitride (GaN), aluminum nitride (AlN), aluminum gallium nitride (Al1−xGaxN), gallium oxide (GaOx), alloys thereof, and combinations thereof.

4. The system of claim 2, wherein like electrical characteristics of the plurality of TVS devices are approximately equal.

5. The device of claim 1, wherein the wide-band-gap semiconductor material of said plurality of TVS devices have has a bandgap that is greater than 2.2 eV.

6. The device of claim 1, wherein said plurality of TVS devices are formed on a single semiconductor substrate.

7. The device of claim 1, wherein said plurality of TVS devices comprise at least one of silicon carbide (SiC), gallium nitride (GaN), aluminum nitride (AlN), aluminum gallium nitride (Al1−xGaxN), gallium oxide (GaOx), alloys thereof, and combinations thereof.

8. The device of claim 1, wherein said plurality of TVS devices are separate devices coupled electrically in parallel with metallic traces between terminals of said plurality of TVS devices.

9. The device of claim 1, wherein said plurality of TVS devices are each on a separate semiconductor dies encapsulated in a single package, said package having at least one common electrode for said plurality of TVS devices.

10. The device of claim 1, wherein each TVS device is a punch-through bi-directional TVS device.

11. The device of claim 10, wherein each punch-trough bi-directional TVS device is on a p++ substrate and comprises a first p+ region on an upper surface of the substrate, an n region on an upper surface of the first p+ region, and a second p+ region on an upper surface of the n region.

12. The device of claim 11, wherein the first p+ region, the n region, and the second p+ region are epitaxial regions.

13. The device of claim 1, wherein said plurality of TVS devices operate using punch-through physics, avalanche, or combinations thereof.

14. The device of claim 1, wherein the total peak current capability of the over-voltage circuit protection device exceeds 10 kA.

15. The device of claim 14, wherein the total peak current capability of the over-voltage circuit protection device exceeds 5 kA.

16. The device of claim 14, wherein the total peak current capability of the over-voltage circuit protection device exceeds 1 kA.

17. The device of claim 1, wherein a leakage current through the over-voltage circuit protection device is less than 10 μA at approximately 125 degrees Celsius, the leakage current being the current through the over-voltage circuit protection device at approximately 50% of the turn-on voltage of the over-voltage circuit protection device.

18. The device of claim 1, wherein a maximum rated operating temperature is of the over-voltage circuit protection device is greater than 150 degrees Celsius.

19. The device of claim 1, further comprising a resistor in electrical series with each of the plurality of TVS devices, said resistor having a positive temperature coefficient of resistance.

20. The device of claim 1, wherein the control signals are configured to modify electrical resistance of respective TVS devices.

* * * * *